US012647136B2

(12) United States Patent
Kim et al.

(10) Patent No.: US 12,647,136 B2
(45) Date of Patent: Jun. 2, 2026

(54) APPARATUS FOR CANCELING NOISE FROM BROADCAST SIGNAL FOR ELECTRIC VEHICLE

(71) Applicant: RF2DIGITAL INC., Seongnam-si (KR)

(72) Inventors: Seong Jun Kim, Seoul (KR); Sung Hyun Yoon, Gwangju-si (KR)

(73) Assignee: RF2DIGITAL INC., Seongnam-si (KR)

( * ) Notice: Subject to any disclaimer, the term of this patent is extended or adjusted under 35 U.S.C. 154(b) by 0 days.

(21) Appl. No.: 19/134,442

(22) PCT Filed: Nov. 5, 2024

(86) PCT No.: PCT/KR2024/017254
§ 371 (c)(1),
(2) Date: May 30, 2025

(87) PCT Pub. No.: WO2026/018974
PCT Pub. Date: Jan. 22, 2026

(65) Prior Publication Data
US 2026/0025154 A1 Jan. 22, 2026

(30) Foreign Application Priority Data

Jul. 16, 2024 (KR) ........................ 10-2024-0093840

(51) Int. Cl.
*H03M 13/37* (2006.01)
*H04L 1/20* (2006.01)
*H04B 1/10* (2006.01)
(52) U.S. Cl.
CPC ........ *H03M 13/3776* (2013.01); *H04L 1/208* (2013.01); *H04B 1/1027* (2013.01)

(58) Field of Classification Search
CPC .......................... H03M 13/3776; H04L 1/208
See application file for complete search history.

(56) References Cited

U.S. PATENT DOCUMENTS 5,511,081 A * 4/1996 Hagenauer .............. H04L 1/007
714/795
5,949,796 A * 9/1999 Kumar .................... H04L 1/007
375/347
(Continued)

FOREIGN PATENT DOCUMENTS

JP 2003-518800 A 6/2003
KR 10-2002-0064337 A 8/2002
(Continued)

OTHER PUBLICATIONS

International Search Report of PCT/KR2024/017254 dated Apr. 9, 2025.
Written Opinion of PCT/KR2024/017254 dated Apr. 9, 2025.

*Primary Examiner* — Joseph D Torres
(74) *Attorney, Agent, or Firm* — Sughrue Mion, PLLC

(57) ABSTRACT

A broadcast signal noise removal apparatus for a vehicle, which decodes a bitstream that is received by an electric vehicle through communication with an external transmission device, then re-encodes the bitstream when an error is detected, then decodes a channel status using a weight, determines whether noise has occurred according to whether the error has been detected, and outputs a bitstream after removing wideband noise of the electric vehicle.

9 Claims, 20 Drawing Sheets

(56)  References Cited

U.S. PATENT DOCUMENTS

| | | | | | |
|---|---|---|---|---|---|
| 6,359,935 | B1 * | 3/2002 | Hui | ..................... | H04L 27/2332 |
| | | | | | 714/792 |
| 6,606,724 | B1 * | 8/2003 | Krieger | ............. | H03M 13/3776 |
| | | | | | 714/755 |
| 6,704,368 | B1 * | 3/2004 | Nefedov | ............... | H04L 1/0068 |
| | | | | | 714/790 |
| 2001/0025358 | A1 * | 9/2001 | Eidson | .................. | H04L 1/0065 |
| | | | | | 714/752 |
| 2002/0165004 | A1 * | 11/2002 | Chen | .................... | H04L 1/0066 |
| | | | | | 455/69 |
| 2004/0157614 | A1 * | 8/2004 | Fujita | ..................... | H04J 13/16 |
| | | | | | 455/446 |
| 2005/0086570 | A1 * | 4/2005 | Ariyoshi | ........... | H03M 13/2957 |
| | | | | | 714/755 |
| 2005/0166129 | A1 * | 7/2005 | Yano | ................. | H03M 13/2957 |
| | | | | | 714/797 |
| 2020/0044775 | A1 * | 2/2020 | Serbetli | ............. | H03M 13/2939 |

FOREIGN PATENT DOCUMENTS

| | | | |
|---|---|---|---|
| KR | 10-2003-0008058 | A | 1/2003 |
| KR | 10-2007-0012090 | A | 1/2007 |
| KR | 10-2009-0025048 | A | 3/2009 |

* cited by examiner

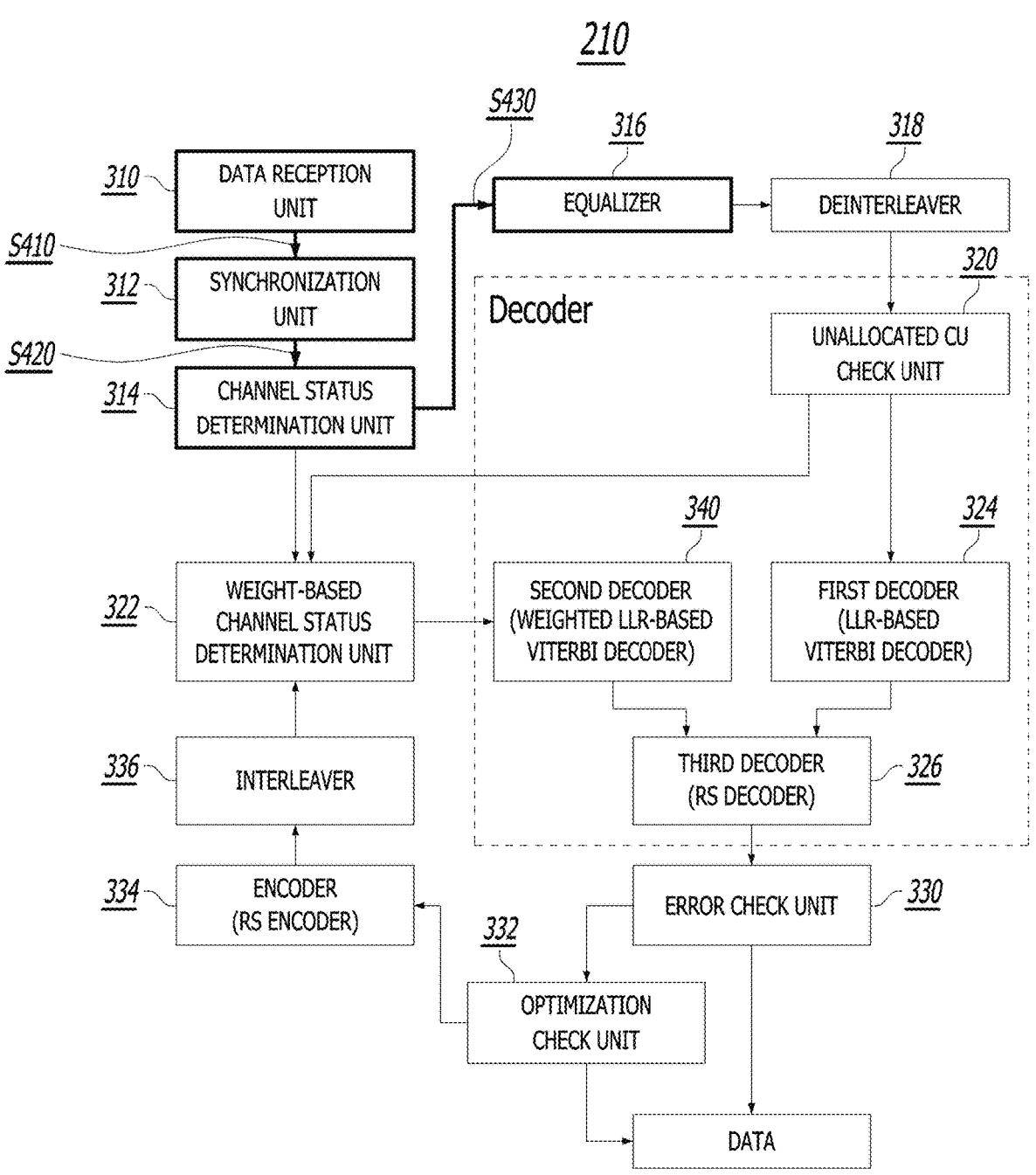

*210*

*S430*

*310* DATA RECEPTION UNIT

*316* EQUALIZER

*318* DEINTERLEAVER

*S410*

*312* SYNCHRONIZATION UNIT

*320*

Decoder

UNALLOCATED CU CHECK UNIT

*S420*

*314* CHANNEL STATUS DETERMINATION UNIT

*340* SECOND DECODER (WEIGHTED LLR-BASED VITERBI DECODER)

*324* FIRST DECODER (LLR-BASED VITERBI DECODER)

*322* WEIGHT-BASED CHANNEL STATUS DETERMINATION UNIT

*326* THIRD DECODER (RS DECODER)

*336* INTERLEAVER

*334* ENCODER (RS ENCODER)

*330* ERROR CHECK UNIT

*332* OPTIMIZATION CHECK UNIT

DATA

Fig. 4a

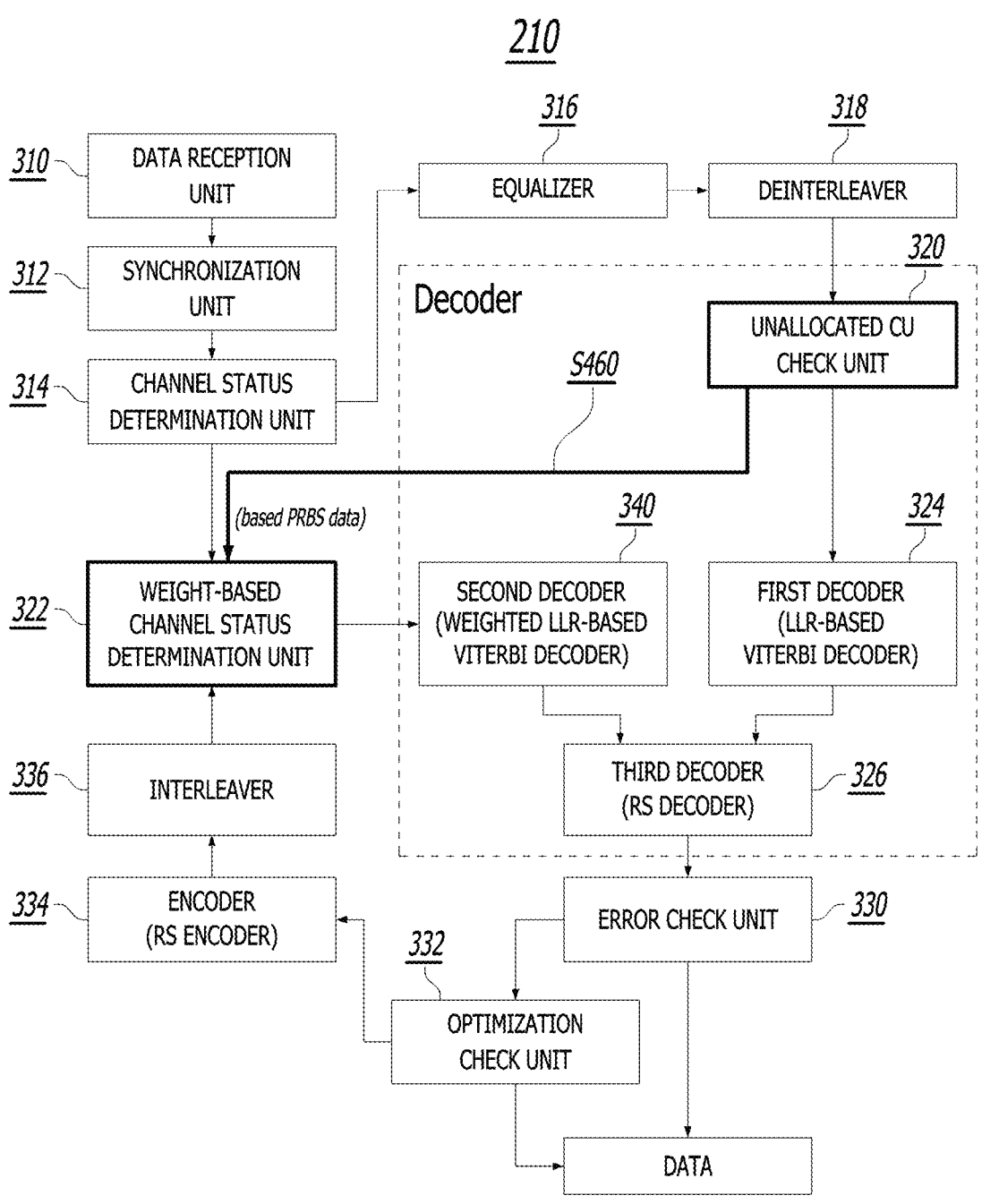

*210*

*316*   *318*

*310* DATA RECEPTION UNIT

EQUALIZER   DEINTERLEAVER

*312* SYNCHRONIZATION UNIT

*320*

Decoder

UNALLOCATED CU CHECK UNIT

*314* CHANNEL STATUS DETERMINATION UNIT

*S460*

*(based PRBS data)*

*322* WEIGHT-BASED CHANNEL STATUS DETERMINATION UNIT

*340* SECOND DECODER (WEIGHTED LLR-BASED VITERBI DECODER)

*324* FIRST DECODER (LLR-BASED VITERBI DECODER)

*336* INTERLEAVER

*326* THIRD DECODER (RS DECODER)

*334* ENCODER (RS ENCODER)

*330* ERROR CHECK UNIT

*332* OPTIMIZATION CHECK UNIT

DATA

Fig. 4c

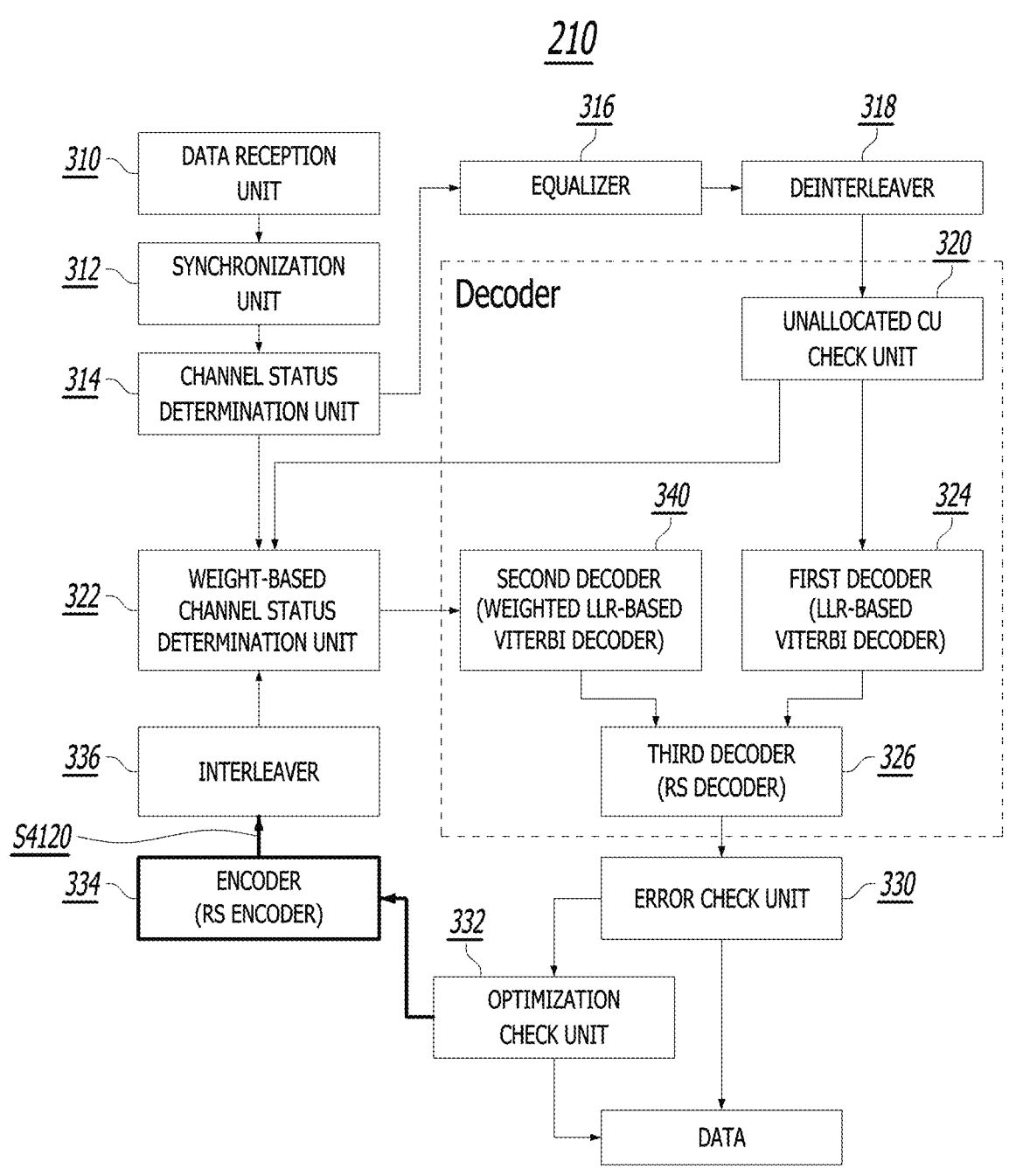

210

- 310 — DATA RECEPTION UNIT
- 312 — SYNCHRONIZATION UNIT
- 314 — CHANNEL STATUS DETERMINATION UNIT
- 316 — EQUALIZER
- 318 — DEINTERLEAVER
- 320 — Decoder
- UNALLOCATED CU CHECK UNIT
- 322 — WEIGHT-BASED CHANNEL STATUS DETERMINATION UNIT
- 340 — SECOND DECODER (WEIGHTED LLR-BASED VITERBI DECODER)
- 324 — FIRST DECODER (LLR-BASED VITERBI DECODER)
- 336 — INTERLEAVER
- 326 — THIRD DECODER (RS DECODER)
- S4120
- 334 — ENCODER (RS ENCODER)
- 330 — ERROR CHECK UNIT
- 332 — OPTIMIZATION CHECK UNIT
- DATA

Fig. 4i

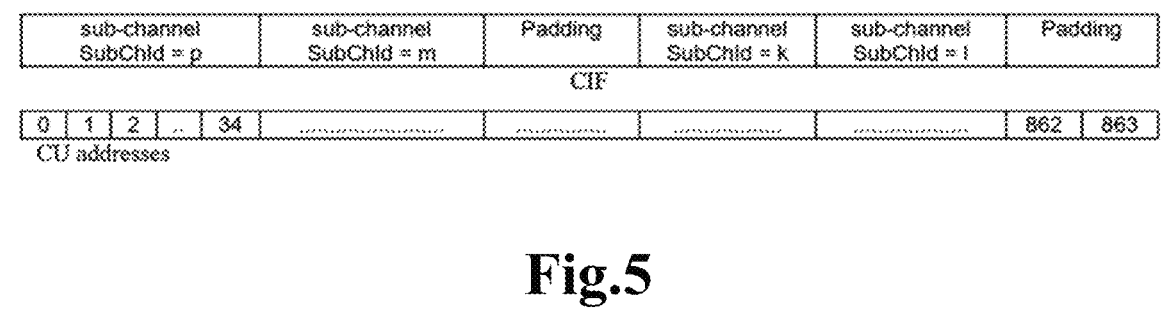

| sub-channel SubChId = p | sub-channel SubChId = m | Padding | sub-channel SubChId = k | sub-channel SubChId = l | Padding |
|---|---|---|---|---|---|

CIF

| 0 | 1 | 2 | .. | 34 | | | | | 862 | 863 |
|---|---|---|---|---|---|---|---|---|---|---|

CU addresses

Fig.5

APPARATUS FOR CANCELING NOISE FROM BROADCAST SIGNAL FOR ELECTRIC VEHICLE

CROSS-REFERENCE TO RELATED APPLICATIONS

This is a National Stage of International Application No. PCT/KR2024/017254 filed Nov. 5, 2024, claiming priority based on Korean Patent Application No. 10-2024-0093840 filed Jul. 16, 2024, the entire disclosures of which are incorporated herein by reference.

TECHNICAL FIELD

Embodiments of the present invention relate to a broadcast signal noise removal apparatus for a vehicle.

BACKGROUND ART

The content described below simply provides background information related to the present embodiment and does not constitute the related art.

The advent of electric vehicles (EVs) and hybrid electric vehicles (HEVs) using high-power motors has required the industry to develop new technologies in broadcast receivers for a vehicle that were not significant problems in conventional internal combustion engines.

In eco-friendly vehicles such as HEVs and EVs, a power conversion system uses a high-voltage battery to operate an electric motor and supply 12 V power. A low DC-DC converter (LDC) is a DC-DC converter that converts a high voltage (200 to 400 V) into a low voltage (12 to 15 V), and in order to maximize efficiency, a switching mode power supply (SMPS) method is used in the LDC. Since SMPS includes pulse-width modulation (PWM) switching (about 100 to 200 KHz) that generates serious electromagnetic compatibility (EMC) noise in the form of switching noise, amplitude modulation (AM) (510 KHz to 1.8 MHz) is a band closest to the harmonics of switching noise and is significantly affected, and even in wideband radio frequency (RF) (wideband-frequency modulation (FM) band, Band-III band), broadcast receivers are affected by new switching noise that did not exist before.

Although vehicle manufacturers are eventually able to match the EMC performance of their vehicles by using shielding and structural modifications (changing vehicle layout and specifications), filtering (expensive high-efficiency capacitors), etc., to reduce LDC noise, sensitive broadcast receivers that amplify small signals received from antennas and restore signals cannot escape the effects of EV noise, and vehicle manufacturers and tier 1 suppliers desire tier 2 part suppliers to manufacture products with built-in algorithms to remove noise of an EV when the tier 2 part suppliers supply their parts.

As common parts of EVs and internal combustion engines, there is a need for a technique for removing noise signals generated by the increased speed of vehicles, that is, for overcoming channel deterioration caused by the complex environment in which vehicles are operated as well as EVs. In particular, in North America and China, there is a need for a technique for improving the performance of receivers as a method of addressing analog co-channel overlap and adjacency problems that interfere with digital radio reception within the FM band.

DISCLOSURE

Technical Problem

The present embodiment is directed to providing a broadcast signal noise removal apparatus for a vehicle, which decodes a bitstream that is received by an electric vehicle through communication with an external transmission device, then re-encodes the bitstream when an error is detected, then decodes a channel status using a weight, determines whether noise has occurred according to whether the error has been detected, and outputs a bitstream after removing wideband noise of the electric vehicle.

Technical Solution

One aspect of the present embodiment provides an active noise removal apparatus which includes a data reception unit configured to receive a bitstream from a transmission device, a deinterleaver configured to deinterleave the bitstream to generate deinterleaved data, a decoder configured to decode the deinterleaved data to generate decoded data, an error check unit configured to check whether an error is detected in the decoded data, and an encoder configured to encode the decoded data to generate encoded data and then transmit the generated encoded data to the decoder when an error is detected in the decoded data.

Advantageous Effects

As described above, according to the present embodiment, it is possible to decode a bitstream that is received by an electric vehicle through communication with an external transmission device, then re-encode the bitstream when an error is detected, then decode a channel status using a weight, determine whether noise has occurred according to whether the error has been detected, and remove wideband noise of the electric vehicle.

DESCRIPTION OF DRAWINGS

FIGS. 4A, 4B, 4C, 4D, 4E, 4F, 4G, 4H, 4I, 4J, 4K, 4L, 4M, and 4N are diagrams illustrating a digital radio signal noise removal method for an electric vehicle according to the present embodiment.

FIG. 5 is a diagram for describing a method of processing a signal in a digital radio according to the present embodiment.

BEST MODE OF THE INVENTION

Hereinafter, the present embodiment will be described in detail with reference to the accompanying drawings.

Figure 1:
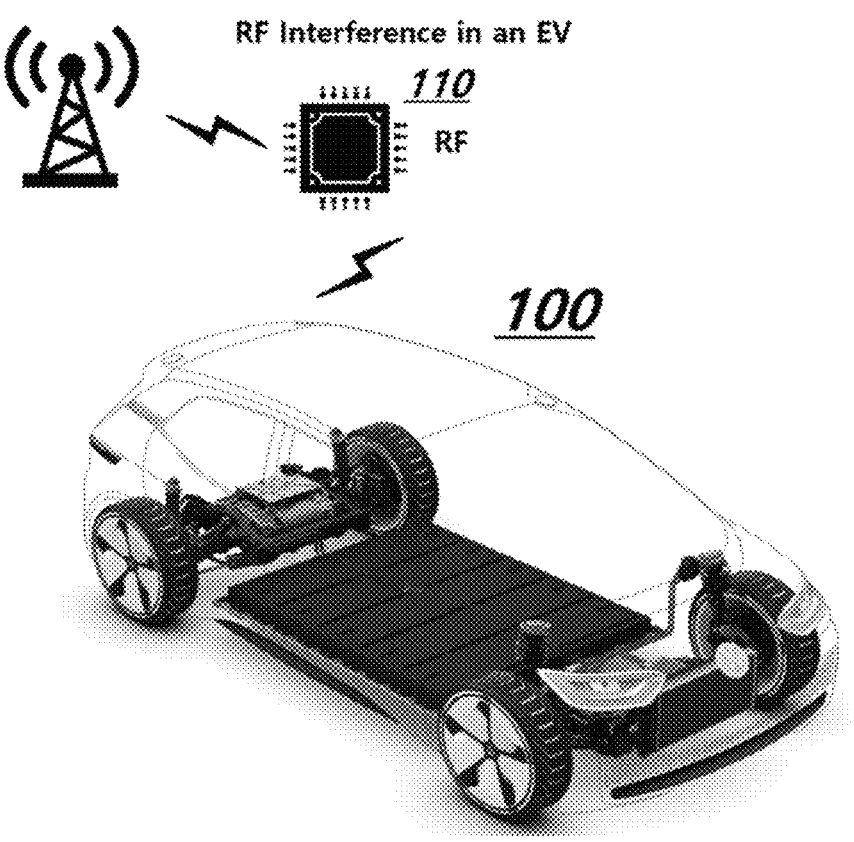
FIG. 1 is a conceptual diagram illustrating a solution for removing noise from a digital radio signal for an electric vehicle according to the present embodiment.

FIG. 1 is a conceptual diagram illustrating a solution for removing noise from a digital radio signal for an electric vehicle according to the present embodiment.

When an electric vehicle 100 performs radio frequency (RF) communication with an external transmission device using a communication module 110, high wideband noise that was not present in conventional internal combustion engines occurs. Here, the wideband noise is noise in an amplitude modulation (AM) band of an electric vehicle that is relatively higher than noise in a frequency modulation (FM) band and/or Band III.

The vehicle diagnostic service malfunctions due to wideband noise that occurs when the electric vehicle 100 performs RF communication with the external transmission device. The electric vehicle 100 has malfunctions, such as mis-determination of broadcast reception status, mis-determination of part failure, etc., due to an internal combustion engine program. The electric vehicle 100 has a problem such as reduced coverage due to reduced sensitivity of digital radio reception.

The communication module 110 mounted in the electric vehicle 100 decodes a bitstream received through RF communication with an external transmission device, then re-encodes the bitstream when an error is detected, then decodes a channel status using a weight, determines whether noise has occurred according to whether an error has been detected, and outputs a bitstream after removing wideband noise of the electric vehicle.

Figure 2:
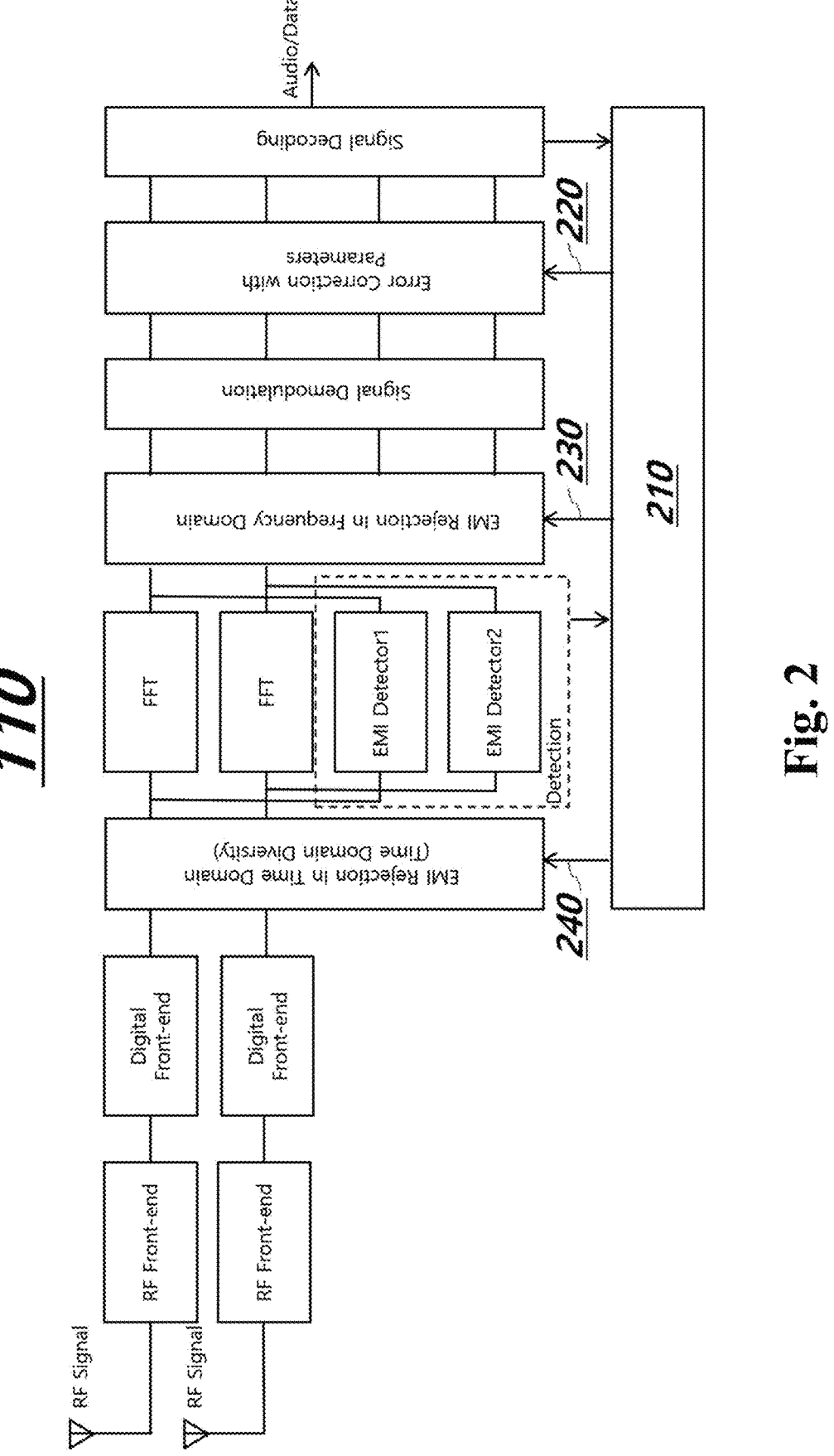
FIG. 2 is a diagram illustrating a digital radio signal noise removal algorithm for an electric vehicle according to the present embodiment.

FIG. 2 is a diagram illustrating a digital radio signal noise removal algorithm for an electric vehicle according to the present embodiment.

A Viterbi iterative coding method is used in the communication module 110 mounted in the electric vehicle 100. The communication module 110 provides a noise removal algorithm on the basis of the Viterbi iterative coding method.

The communication module 110 minimizes errors and accurately transmits data in digital communication using the Viterbi iterative coding method, on the basis of a mounted active noise removal apparatus 210. The communication module 110 predicts errors that may occur in a channel between a transmitter and a receiver using the Viterbi iterative coding method and transmits data by adding information for correcting the errors. The communication module 110 may minimize errors and restore accurate data. The communication module 110 selects an optimal coding method in consideration of the characteristics of the channel using the Viterbi iterative coding method and minimizes errors through an iterative process.

The communication module 110 corrects errors in a communication system using the Viterbi iterative coding method to increase the efficiency of decoding. The communication module 110 accurately recovers transmitted data using a Viterbi algorithm repeatedly to minimize noise and interference mainly occurring in a communication channel.

The communication module 110 reduces errors while decoding the same data block multiple times by performing iterative decoding based on a Viterbi algorithm of the Viterbi iterative coding method.

The communication module 110 encodes original data with a convolution code and transmits the encoded data. Here, the encoded data includes duplicate bits and error correction information. The communication module 110 transmits the encoded data through a channel. The communication module 110 performs initial decoding on the received data using a Viterbi algorithm. The communication module 110 performs iterative decoding on the basis of a result of the initial decoding. Here, the number of iterations is determined according to the system settings and required performance. The communication module 110 terminates the iteration when iterative decoding has been performed a specific number of times or an error rate of the decoding result reaches a satisfactory level, according to a termination condition.

The active noise removal apparatus 210 may perform Viterbi iterative coding using each of a first path 220, a second path 230, and a third path 240 that are illustrated in FIG. 2. However, in the following description, according to an exemplary embodiment that is the present embodiment, the content of the active noise removal apparatus 210 performing Viterbi iterative coding using the first path 220 will be described with reference to FIGS. 3 to 6B.

When the active noise removal apparatus 210 performs iterative coding using the first path 220, it is possible to perform iterative coding up to a synchronization unit 312, which is a front end of a fast Fourier transform (FFT).

When the active noise removal apparatus 210 performs Viterbi iterative coding using the second path 230, it is possible to perform iterative coding up to a channel status determination unit 314, which is a rear end of the FFT. When the active noise removal apparatus 210 performs iterative coding using the second path 230, a weight-based channel status determination unit 322 included in the active noise removal apparatus 210 is applied to the rear end of the FFT through a reverse unallocated CU check unit, an interleaver, and an inverse equalizer (EQ) (mapper).

When the active noise removal apparatus 210 performs iterative coding using the third path 240, it is possible to perform iterative coding up to the synchronization unit 312, which is the front end of the FFT. When the active noise removal apparatus 210 performs iterative coding using the third path 240, the weight-based channel status determination unit 322 included in the active noise removal apparatus 210 is applied to the rear end of the FFT through a reverse unallocated CU check unit, an interleaver, an inverse EQ (mapper), and an inverse FFT (IFFT).

The active noise removal apparatus 210 has the best performance when performing iterative coding using the third path 240, but in consideration of the implementation difficulty, price, resource usage, etc., the exemplary embodiment of the present invention is a case in which the active noise removal apparatus 210 performs iterative coding using the first path 220. The performance exceeds the International Telecommunication Union (ITU) theoretical performance only with a result of the active noise removal apparatus 210 performing the iterative coding using the first path 220.

A structure of the active noise removal apparatus 210 mounted on the communication module 110 is not limited to that of FIG. 2 and may be expanded and applied.

Figure 3:
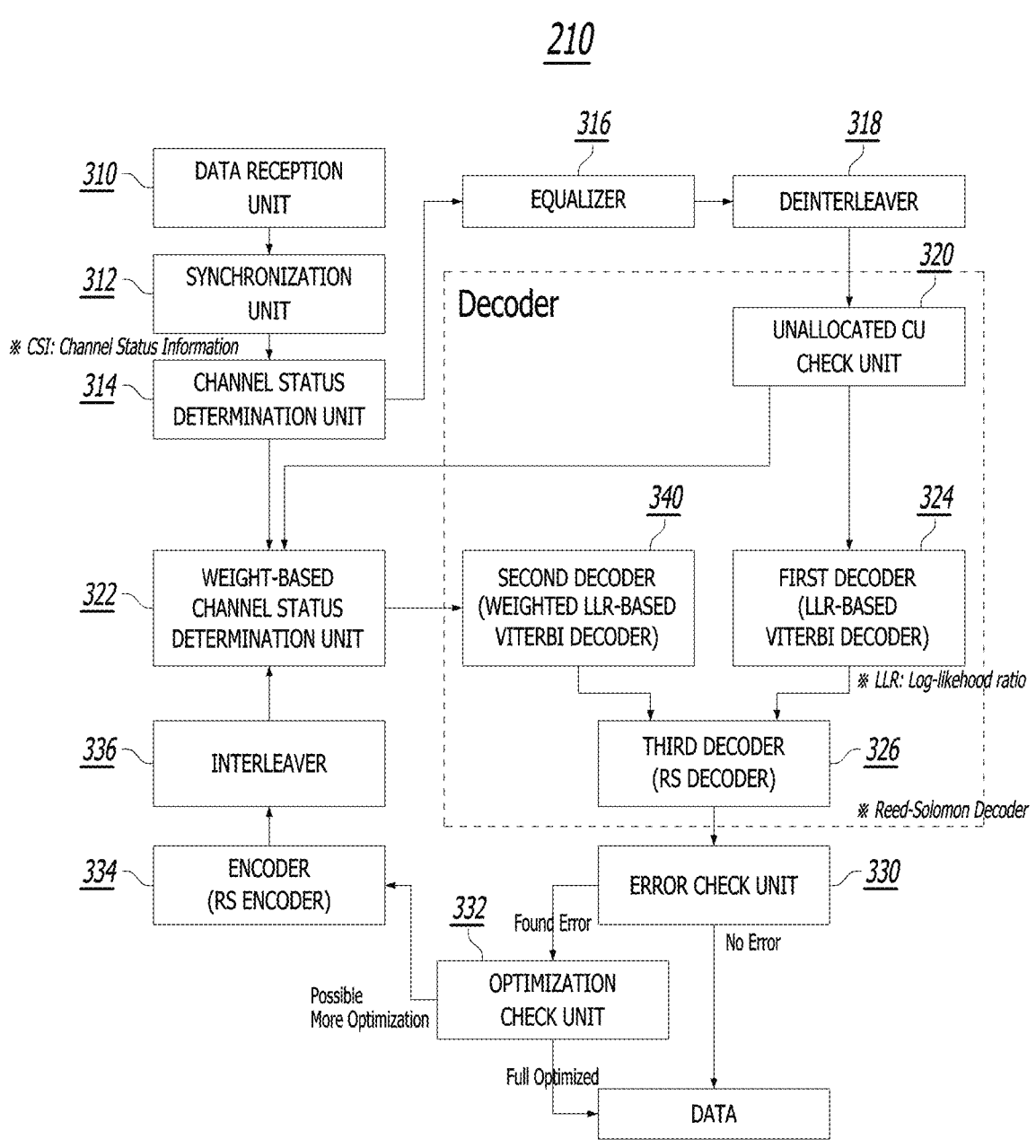
FIG. 3 is a diagram illustrating an active noise removal apparatus according to the present embodiment.
Figure 4B:
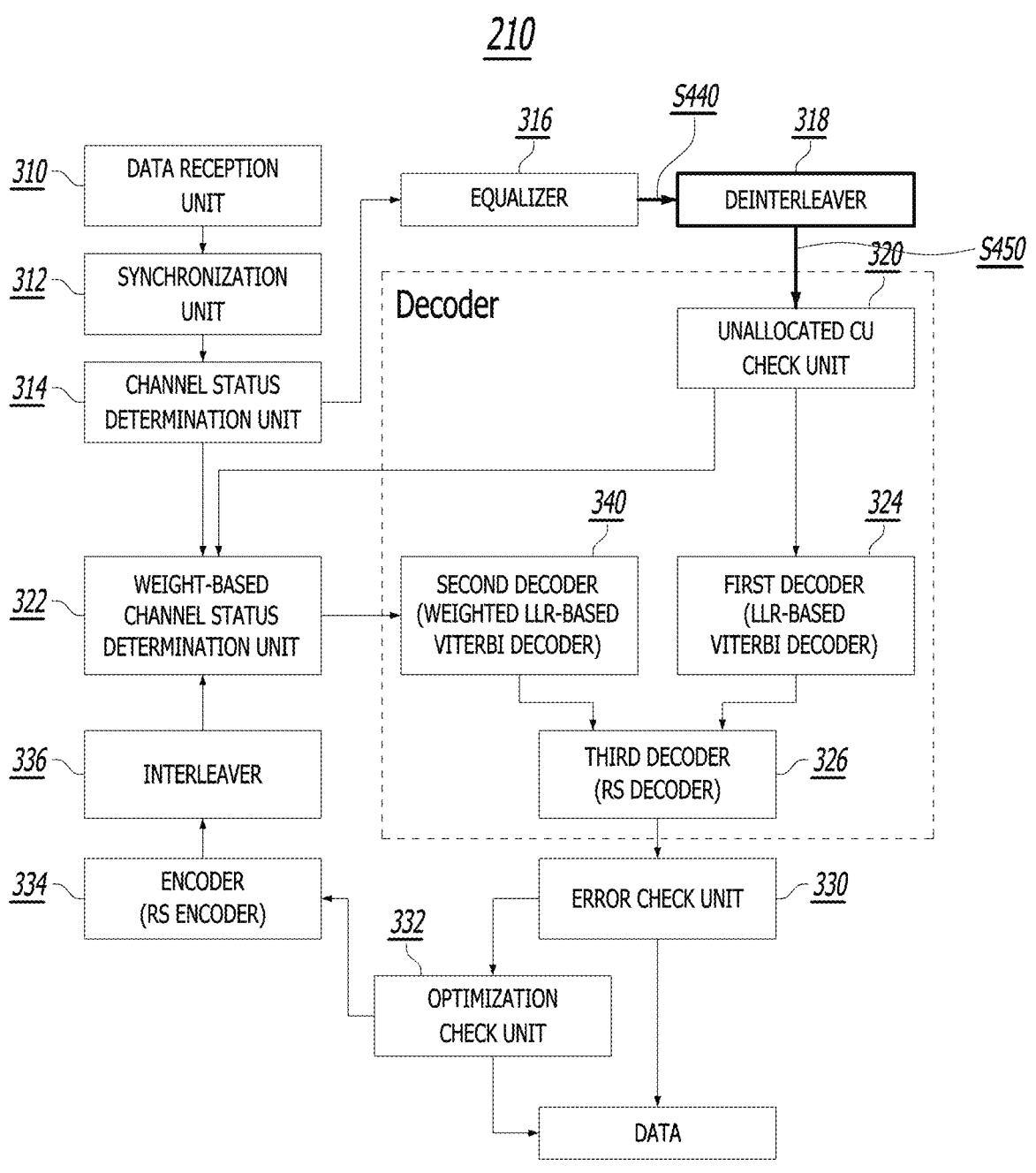
Figure 4D:
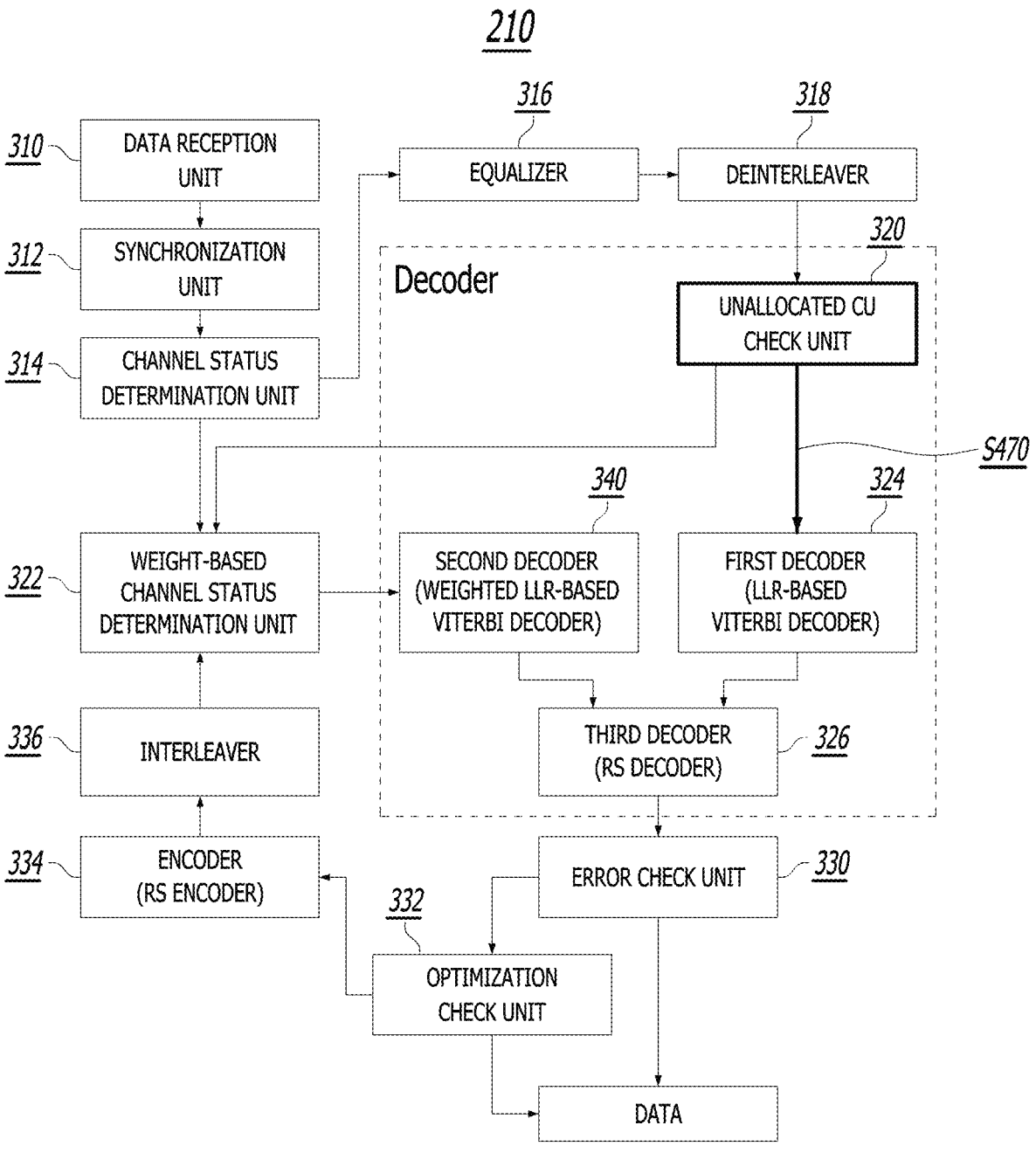
Figure 4E:
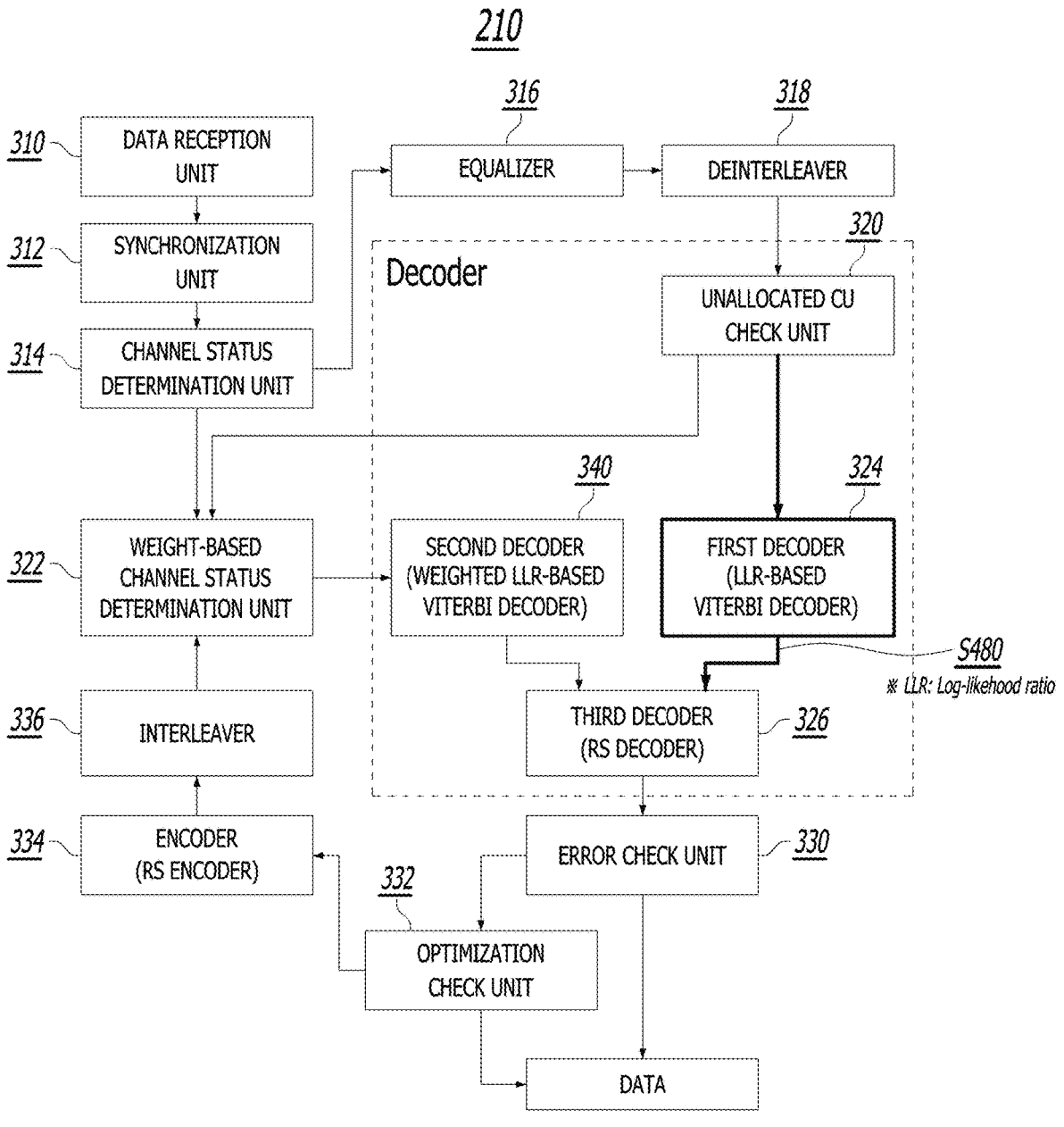
Figure 4F:
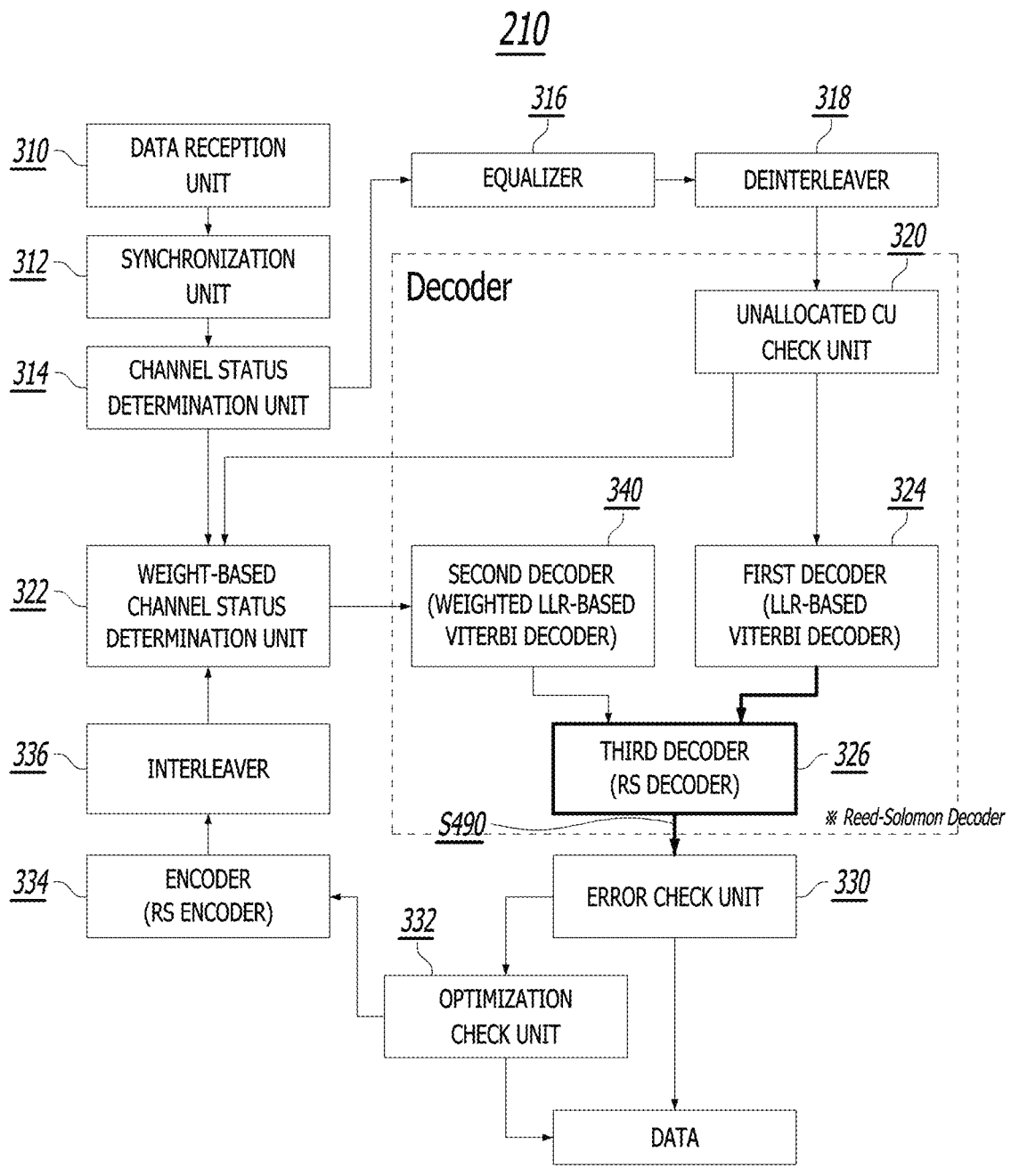
Figure 4G:
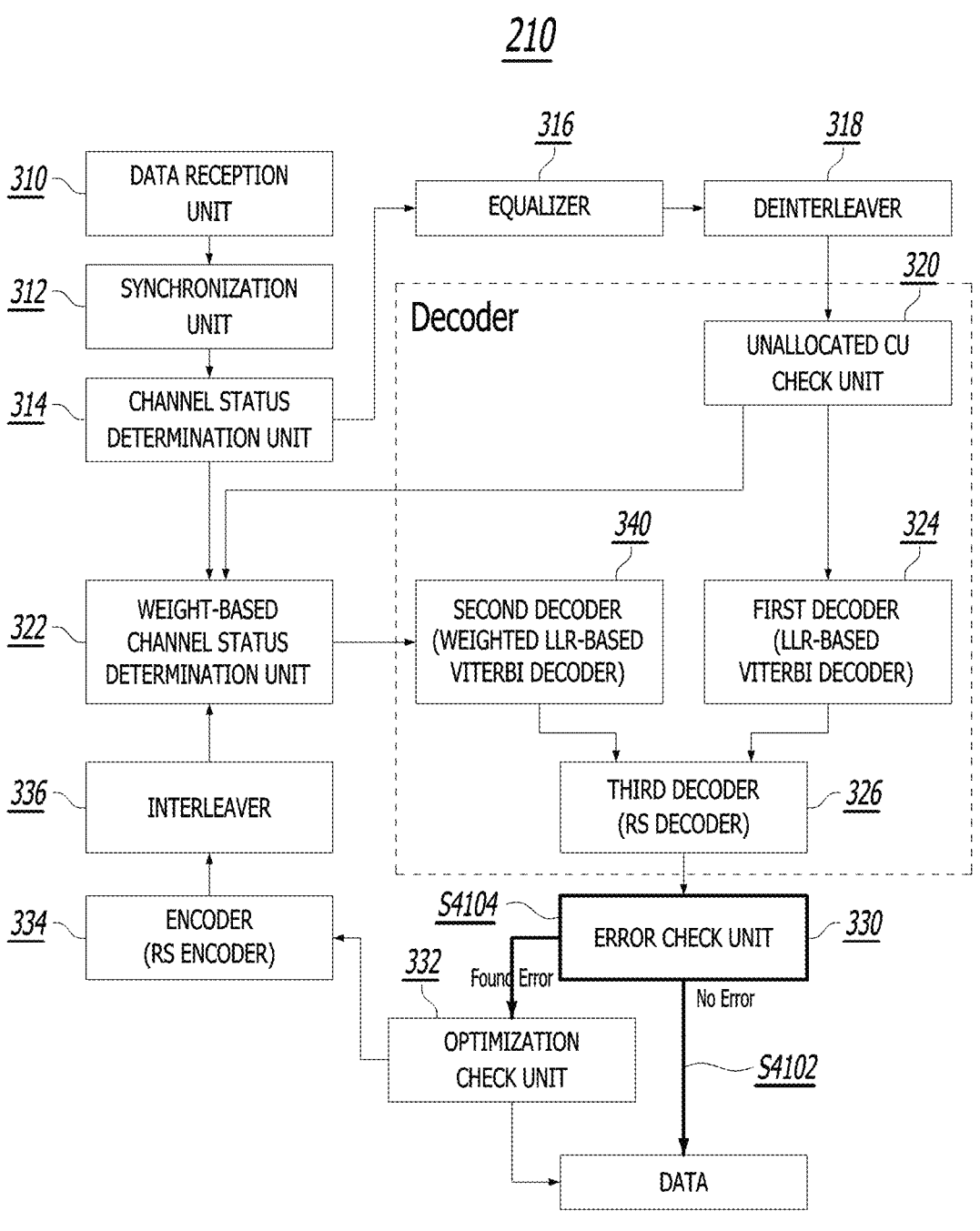
Figure 4H:
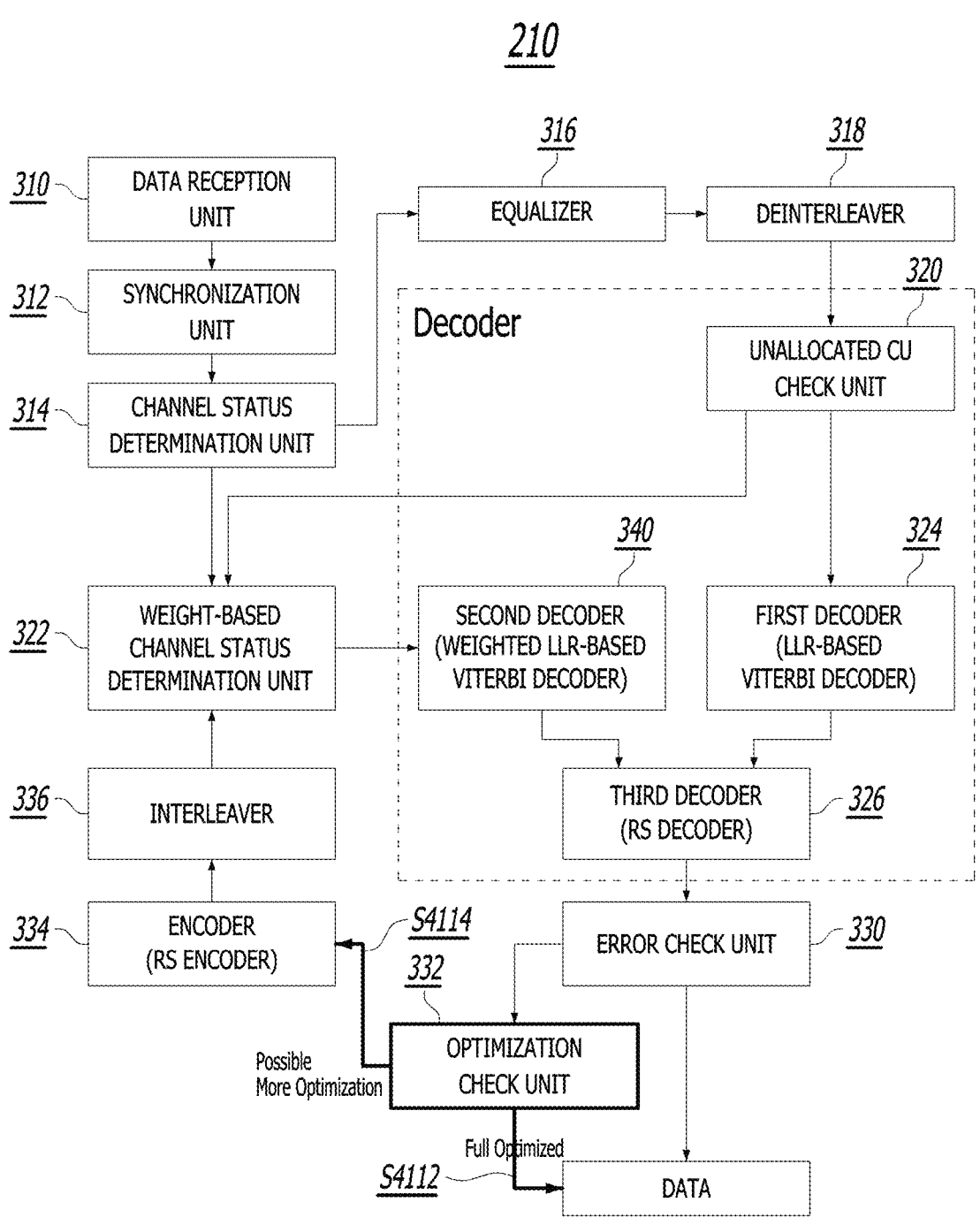
Figure 4J:
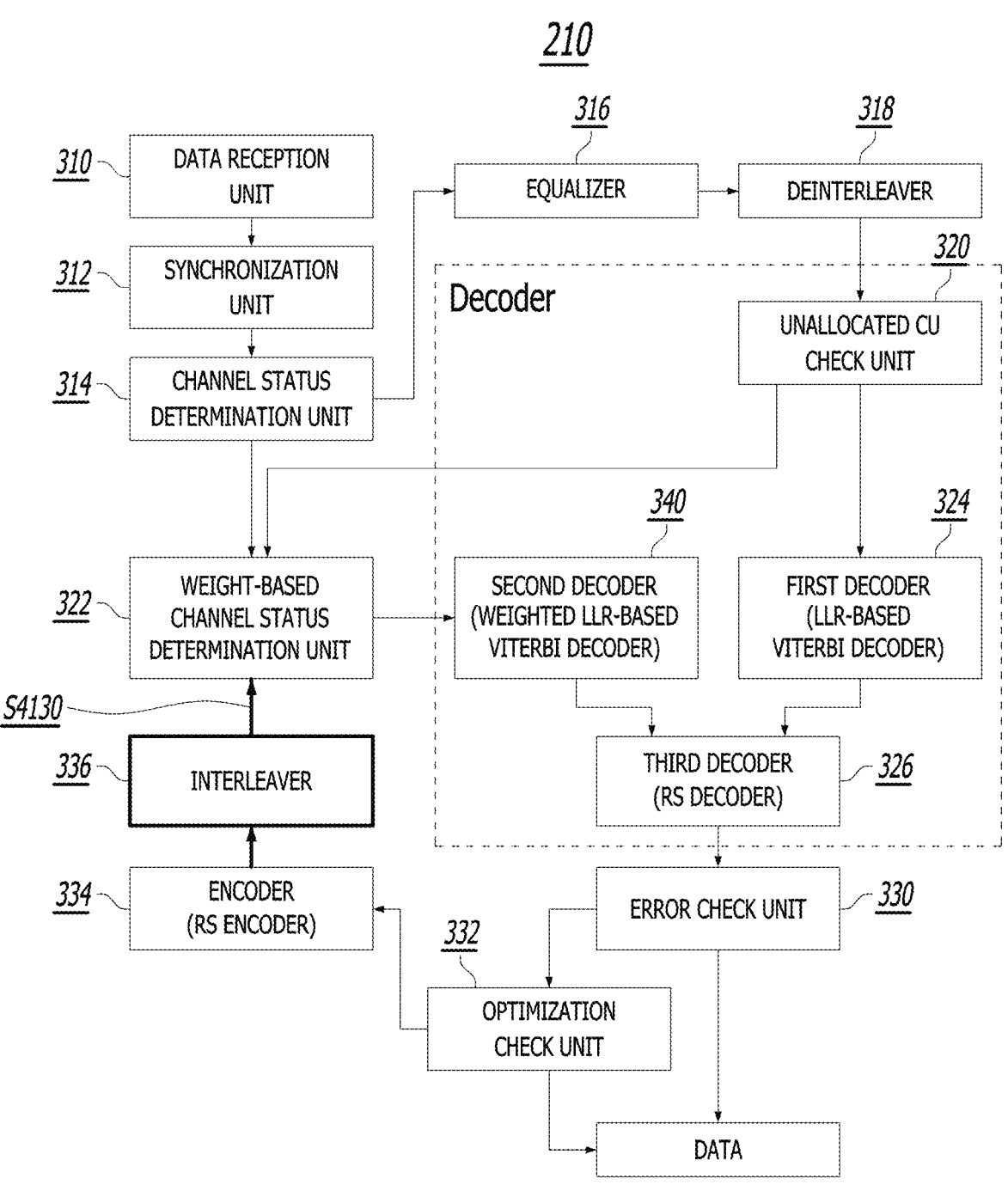
Figure 4K:
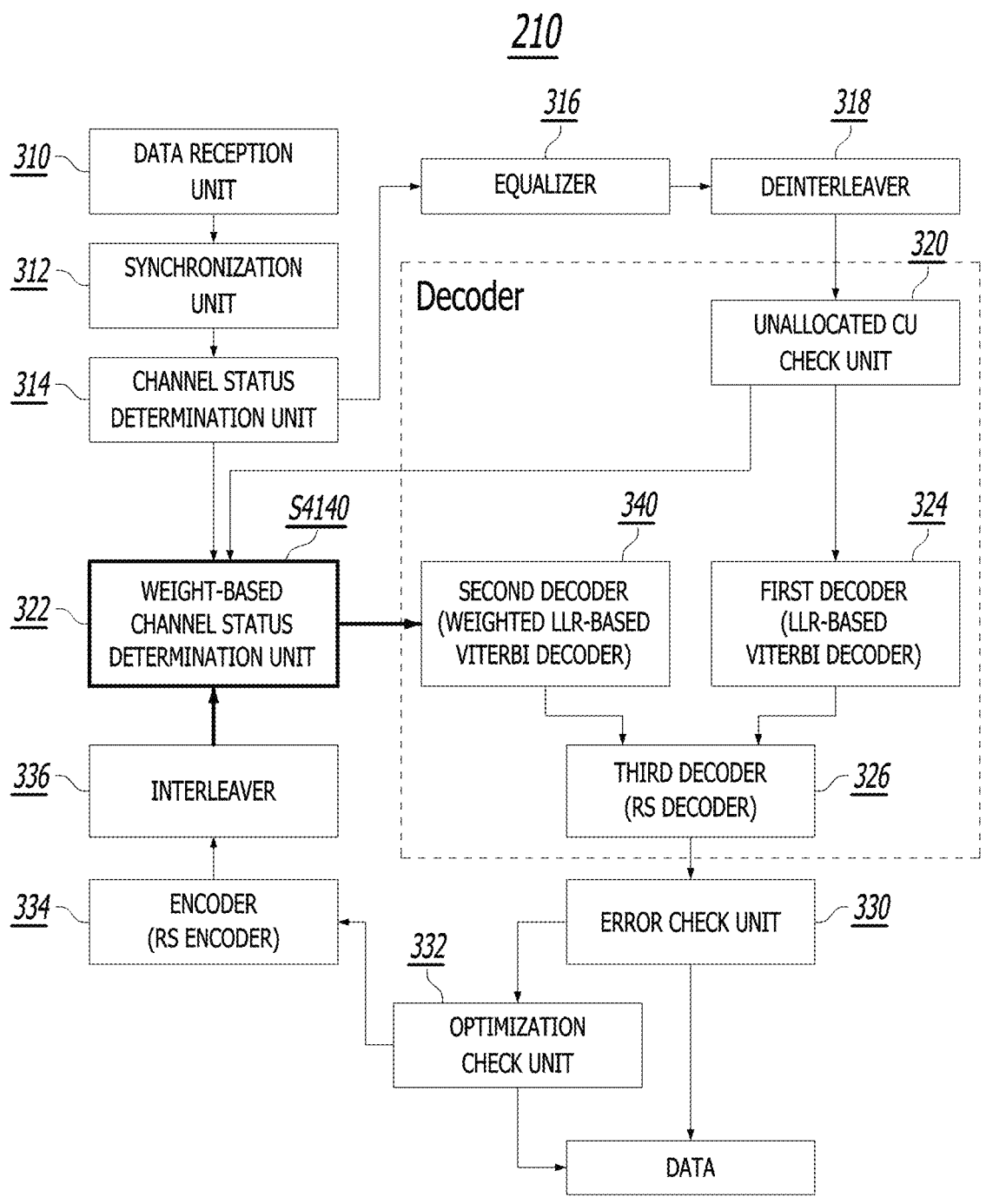
Figure 4L:
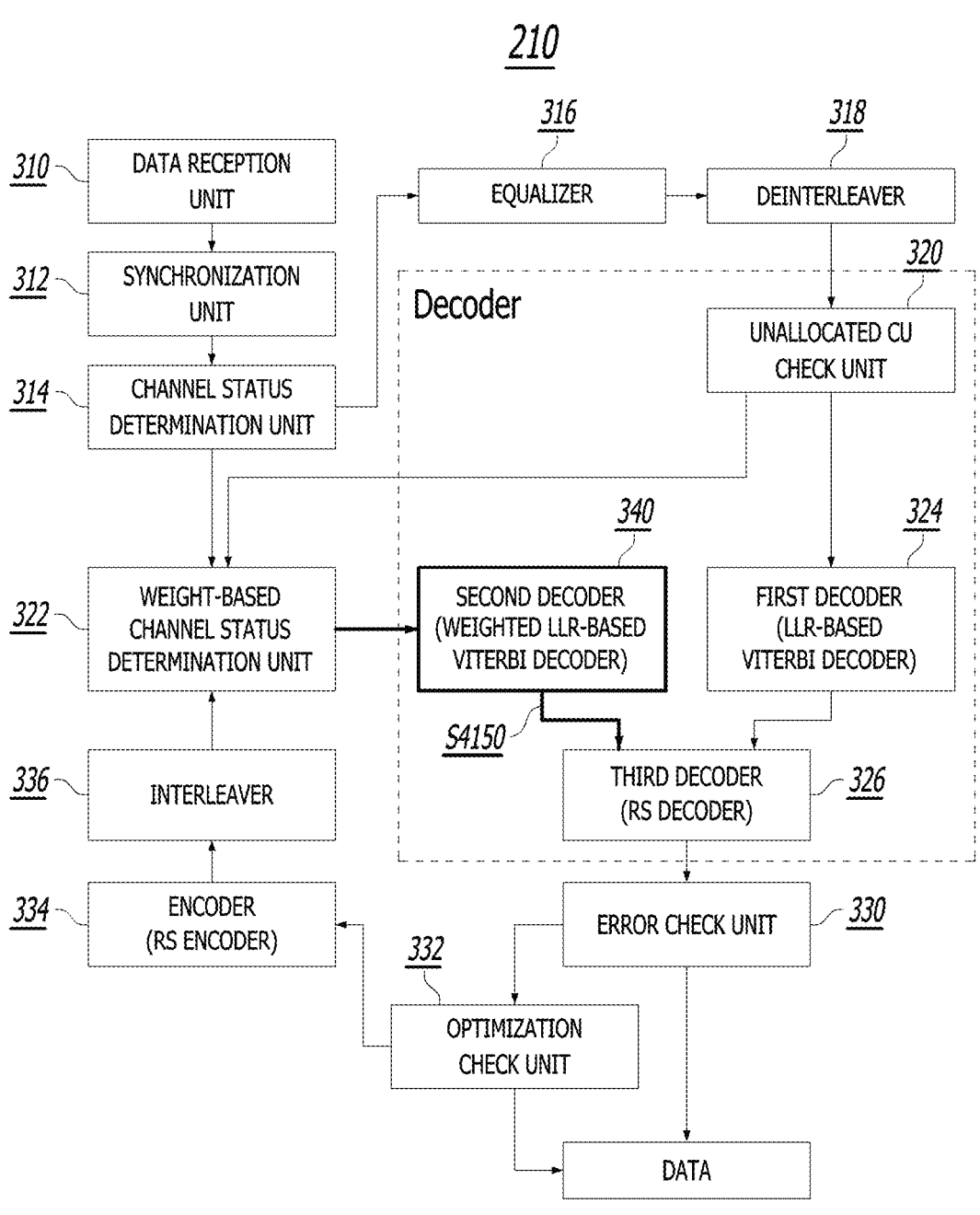
Figure 4M:
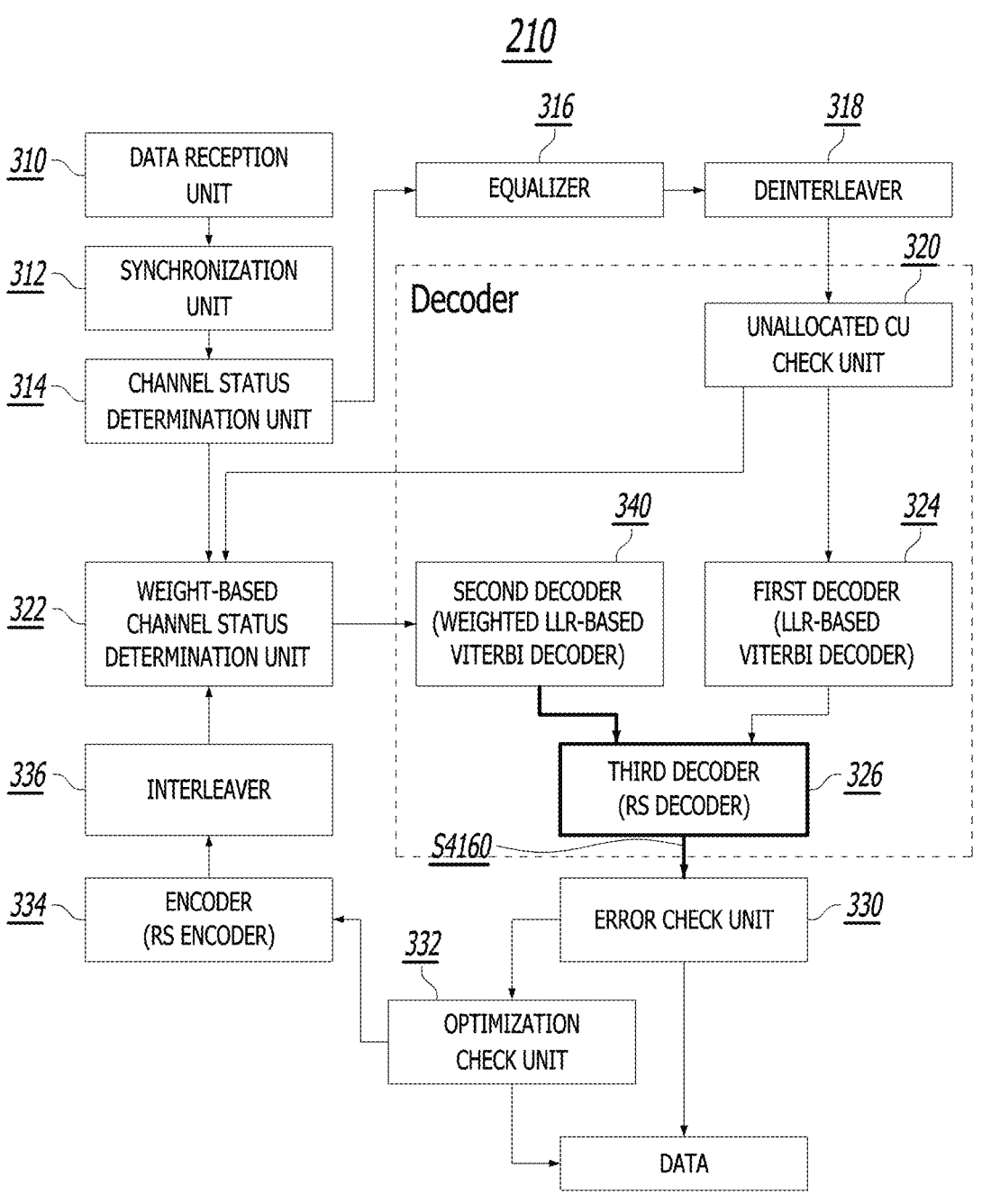
Figure 4N:
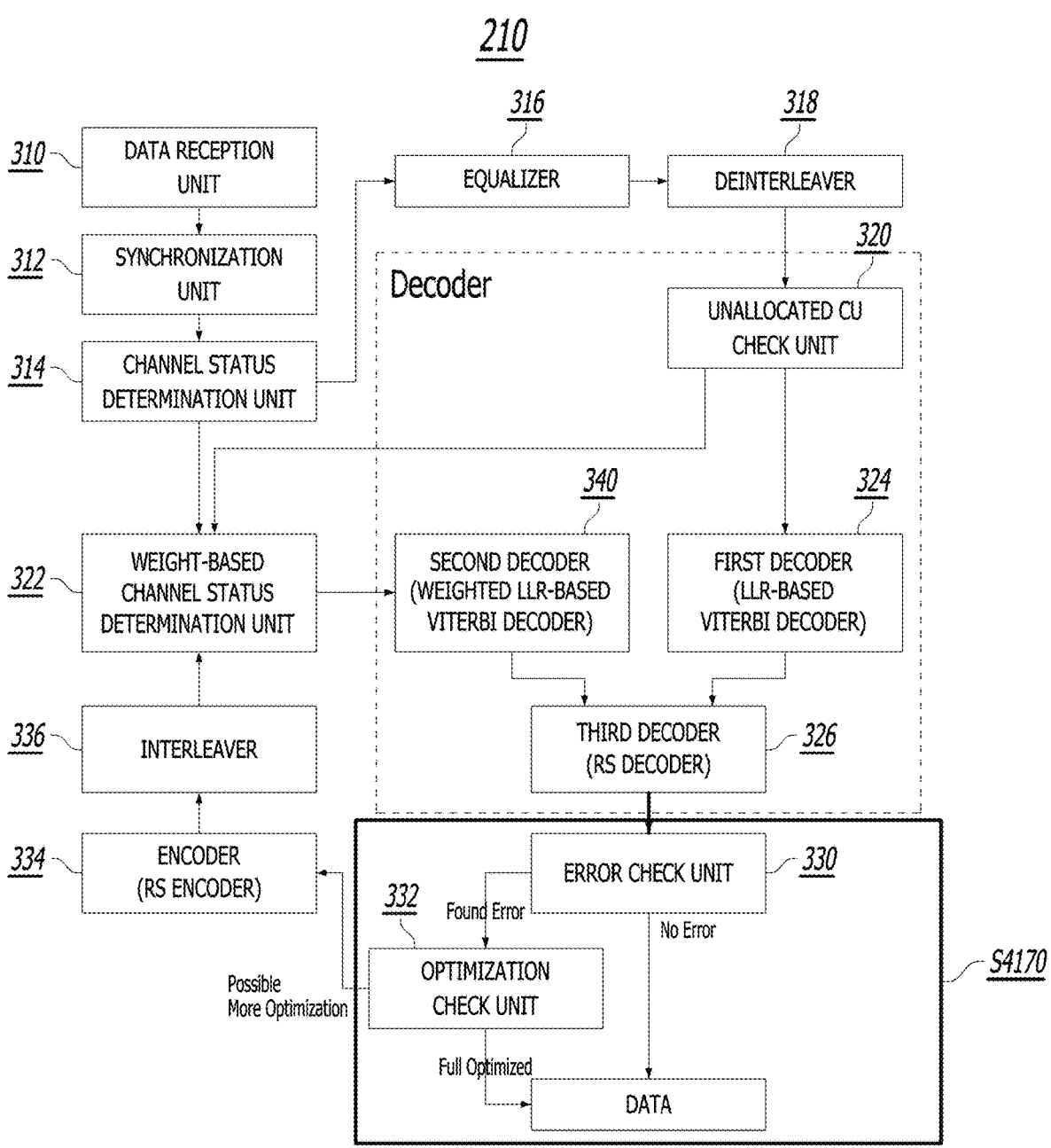

FIG. 3 is a diagram illustrating an active noise removal apparatus according to the present embodiment.

The active noise removal apparatus 210 according to the present embodiment includes a data reception unit 310, a synchronization unit 312, a channel status determination unit 314, an equalizer 316, a deinterleaver 318, an unallocated capacity unit (CU) check unit 320, a weight-based channel status determination unit 322, a first decoder 324, a second decoder 340, a third decoder 326, an error check unit 330, an optimization check unit 332, an encoder 334, and an interleaver 336. The components included in the active noise removal apparatus 210 are not necessarily limited thereto.

The components included in the active noise removal apparatus 210 may be connected to a communication path that connects software modules or hardware modules within the apparatus and may operate organically with each other. These components communicate with each other using one or more communication buses or signal lines.

Each component of the active noise removal apparatus 210 illustrated in FIG. 3 is a unit that processes at least one function or operation, and may be implemented as a software module, a hardware module, or a combination of software and hardware.

The data reception unit 310 receives a bitstream from a transmission device.

The synchronization unit 312 synchronizes a timing and frequency of the bitstream to generate a synchronization signal.

The channel status determination unit 314 determines a channel status on the basis of the synchronization signal to generate channel status determination information.

The equalizer 316 corrects the frequency characteristics of the signal on the basis of the channel status determination information to generate an equalized signal. The equalizer 316 generates the equalized signal by emphasizing (boosting) or reducing (cutting) a specific frequency band of the channel status determination information.

The deinterleaver 318 deinterleaves the equalized signal including the bitstream to generate deinterleaved data.

The unallocated CU check unit 320 checks whether there is an unallocated CU that is not used in the deinterleaved data. When there is an unallocated CU that is not used in the deinterleaved data, the unallocated CU check unit 320 generates CU allocation data obtained by filling the unallocated CU with pseudo random binary sequence (PRBS) signals and then transmits the generated CU allocation data to the weight-based channel status determination unit 322.

The weight-based channel status determination unit 322 applies a weight for the channel status to the interleaved data to generate weight-based channel status determination information and transmits the generated weight-based channel status determination information to the second decoder 340. The weight-based channel status determination unit 322 assigns the highest probability weight to channel status information (CSI) of a channel (mutually known pattern) related to the PRBS signals on the basis of the PRBS signals included in the CU allocation data to reduce the probability of errors.

A decoder decodes the deinterleaved data to generate decoded data. The decoder includes the unallocated CU check unit 320, the first decoder 324, the second decoder 340, and the third decoder 326.

The first decoder 324 decodes the deinterleaved data to generate first decoded data. The second decoder 340 decodes the weight-based channel status determination information to generate second decoded data. The third decoder 326 decodes at least one of the first decoded data and the second decoded data to generate third decoded data.

The error check unit 330 checks whether an error is detected in the decoded data. When no error is detected in the third decoded data, the error check unit 330 determines that there is no error in the corresponding data ("No error") and outputs the corresponding data. When an error is detected in the third decoded data, the error check unit 330 determines that there is noise in the corresponding data ("Found Error") and transmits the corresponding data to the optimization check unit 332.

The optimization check unit 332 checks whether the error detected from the third decoded data is within a preset critical range. When the error detected from the third decoded data is within the preset critical range, the optimization check unit 332 determines that the corresponding data has weak noise and outputs the corresponding data ("Full Optimized"). When the error detected from the third decoded data is outside of the preset critical range, the optimization check unit 332 determines that the corresponding data requires additional optimization and transmits the corresponding data to a Reed-Solomon (RS) encoder ("Possible More Optimization").

The optimization check unit 332 continues to perform iterations when weak noise is detected in the second decoder 340. The optimization check unit 332 exits a loop upon reaching the limited number of iterations. When the optimization check unit 332 determines that a previous iteration decoding error and a current iteration decoding error are the same and that there is no further improvement even when the determination of Full Optimized is repeated before reaching the limited number of iterations, the optimization check unit 332 exits the iteration coding.

The weight-based channel status determination unit 322 converts only signal data corresponding to "No Alarm" ("No error") output from the second decoder 340 into a high-efficiency signal and changes input data of a Viterbi decoder. The unallocated CU check unit 320 reuses a signal corresponding to Alarm (Error) output from the third decoder 326 as an incoming signal.

The optimization check unit 332 re-verifies whether the determination on whether it is fully optimized is correct when the previous iteration coding error and the current iteration coding error are the same. The optimization check unit 332 stores an exit value, and in consideration of a case in which a convergence state is incorrect, performs iteration decoding using a new convergence parameter instead of a parameter with which it was performed for the exit value (may be performed in parallel or serially). When the optimization check unit 332 finds a case in which even any noise is reduced through several convergence parameters, the optimization check unit 332 newly applies the several convergence parameters to make the error zero.

When an error is detected in the decoded data, the encoder 334 encodes the decoded data to generate encoded data and then transmits the generated encoded data to the second decoder 340 via the interleaver 336 and the weight-based channel status determination unit 322.

The interleaver 336 interleaves the encoded data to generate interleaved data.

FIGS. 4A, 4B, 4C, 4D, 4E, 4F, 4G, 4H, 4I, 4J, 4K, 4L, 4M, and 4N are diagrams illustrating a digital radio signal noise removal method for an electric vehicle according to the present embodiment.

The data reception unit 310 receives a bitstream from a transmission device (S410). The synchronization unit 312 synchronizes a timing and frequency of the bitstream to generate a synchronization signal (S420). The channel status determination unit 314 determines a channel status on the basis of the synchronization signal to generate channel status determination information (S430).

The equalizer 316 corrects the frequency characteristics of the signal on the basis of the channel status determination information to generate an equalized signal (S440). In operation S440, the equalizer 316 generates the equalized signal by emphasizing (boosting) or reducing (cutting) a specific frequency band of the channel status determination information.

The deinterleaver 318 deinterleaves the equalized signal including the bitstream to generate deinterleaved data (S450). In operation S450, the deinterleaver 318 rearranges the order of the data string into a certain unit (e.g., columns and rows of a block, etc.) to generate the deinterleaved data. In operation S450, the deinterleaver 318 may recover a lost bit by making the effect appear locally even when the bit in the middle of the data string is lost due to momentary noise.

The unallocated CU check unit 320 checks whether there is an unallocated CU that is not used in the deinterleaved data (S460). In operation S460, when there is an unallocated CU that is not used in the deinterleaved data, the unallocated CU check unit 320 generates CU allocation data obtained by filling the unallocated CU with PRBS signals and then transmits the generated CU allocation data to the weight-based channel status determination unit 322. The weight-based channel status determination unit 322 receives the CU allocation data obtained by filling the unallocated CU with PRBS signals from the unallocated CU check unit 320. The weight-based channel status determination unit 322 assigns a weight to CSI of a channel (mutually known pattern) related to the PRBS signals on the basis of the PRBS signals included in the CU allocation data to reduce the probability of errors.

In operation S460, the unallocated CU check unit 320 may obtain data that is actually used in comparison to the capacity allocated in a digital radio for the unused unallocated CU. The unallocated CU check unit 320 may analyze a header of a stream of the actually used data.

The unallocated CU check unit 320 checks whether there is an unallocated CU that is not used in the deinterleaved data (S470). In operation S470, when there is no unallocated CU that is not used in the deinterleaved data, the unallocated CU check unit 320 transmits the deinterleaved data to the first decoder 324.

The first decoder 324 decodes the deinterleaved data to generate first decoded data (S480). In operation S480, the first decoder 324 decodes a data string of the deinterleaved data to generate the first decoded data. The first decoder 324 decodes the deinterleaved data on the basis of a Viterbi algorithm to generate the first decoded data. When the first decoder 324 performs the Viterbi algorithm, the first decoder 324 uses a log-likelihood ratio (LLR) value of each bit and determines an optimal bit using the LLR test.

The third decoder 326 restores bits of a portion in which an error is detected in the first decoded data, to generate third decoded data (S490). In operation S490, the third decoder 326 restores the bits of the portion in which the error is detected in the first decoded data, on the basis of RS codes, to generate the third decoded data.

The error check unit 330 additionally checks whether an error is detected in the third decoded data. As a result of the check, when no error is detected in the third decoded data, the error check unit 330 determines that there is no noise in the corresponding data ("No error") and outputs the corresponding data (S4102). As the result of the check, when an error is detected in the third decoded data, the error check unit 330 determines that there is noise in the corresponding data ("Found Error") and transmits the corresponding data to the optimization check unit 332 (S4104)

The optimization check unit 332 checks whether the error detected from the third decoded data is within a preset critical range. As the result of the check, when the error detected from the third decoded data is within the preset critical range, the optimization check unit 332 determines that the corresponding data has weak noise ("Full Optimized") and outputs the corresponding data (S4112). The optimization check unit 332 compares the error detected from the third decoded data with a previous error to check the possibility of improvement. When the optimization check unit 332 recognizes that there is no possibility of improvement, the optimization check unit 332 determines that the corresponding data has already been optimized. As the result of the check, when the error detected from the third decoded data is outside of the preset critical range, the optimization check unit 332 determines that the corresponding data requires additional optimization and transmits the corresponding data to the RS encoder ("Possible More Optimization") (S4114).

The encoder 334 encodes the third decoded data from which the error that is outside of the preset critical range is detected, to generate encoded data (S4120). In operation S4120, the encoder 334 encodes the third decoded data from which the error that is outside of the preset critical range is detected, using RS codes, to generate the encoded data.

The interleaver 336 interleaves the encoded data to generate interleaved data (S4130). In operation S4130, the interleaver 336 rearranges the order of the data string of the interleaved data into a certain unit (e.g., columns and rows of a block, etc.) to generate the interleaved data.

The weight-based channel status determination unit 322 applies a weight for the channel status to the interleaved data to generate weight-based channel status determination information (S4140). Since the data of the RS encoder 334 is error-free data, the channel weight related to the bits distributed through the RS encoder 334 and the interleaver 336 is applied with the highest value, not the value extracted from the CSI.

The second decoder 340 (weighted LLR-based Viterbi decoder) decodes the weight-based channel status determination information to generate second decoded data (S4150). In operation S4150, the second decoder 340 decodes the data string of the weight-based channel status determination information to generate the second decoded data. The second decoder 340 decodes the weight-based channel status determination information on the basis of a Viterbi algorithm to generate the second decoded data. When the second decoder 340 performs the Viterbi algorithm, the second decoder 340 uses an LLR value of each bit and determines an optimal bit using the LLR test.

The third decoder 326 restores bits of a portion in which an error is detected in the second decoded data, to generate third decoded data (S4160). In operation S4160, the third decoder 326 restores the bits of the portion in which the error is detected in the first decoded data, on the basis of RS codes, to generate the third decoded data.

The error check unit 330 and the optimization check unit 332 repeat the process of checking whether an error is detected in the third decoded data.

In FIG. 4, although operations S410 to S4170 are described as being performed sequentially, the present embodiment is not necessarily limited thereto. In other words, since it may be implemented by changing the operations described in FIG. 4 and performing the operations or performing one or more operations in parallel, FIG. 4 is not limited to any chronological order.

As described above, the method of actively removing noise from the digital radio signal for an electric vehicle according to the present embodiment described in FIG. 4 may be implemented as a program and recorded on a computer-readable recording medium. A computer-readable recording medium on which a program for implementing the digital radio signal noise removal method for an electric vehicle according to the present embodiment is recorded includes any type of recording device that stores data that can be read by a computer system.

FIG. 5 is a diagram for describing a method of processing a signal in a digital radio according to the present embodiment.

The unallocated CU check unit 320 checks whether there is an unallocated CU that is not used in the deinterleaved data received from the deinterleaver 318. As a result of the check, when there is found to be no unallocated CU that is not used in the deinterleaved data, the unallocated CU check unit 320 transmits the deinterleaved data to the first decoder 324.

The unallocated CU check unit 320 fills the unallocated CU that is not used in the deinterleaved data with PRBS signals. Since the PRBS signals are mutually known patterns, a weight is applied to CSI related to the PRBS signals to reduce the probability of errors.

The deinterleaved data has a bit structure of common interleaved frame (CIF). Since each vector Cr present at an output of a time interleaver contains a multiple of 64 bits, each sub-channel occupies an integer number of CUs in the CIF. The number of CUs required for a sub-channel during the CIF of time index r is equal to Nr/64.

The vector Cr for various sub-channels should be multiplexed in such a way that every sub-channel occupies an integer number of consecutive CUs. An address of the CU assigned to a first bit of the vector Cr is called a starting address. The CIF bits are assigned consecutively at the output of the time interleaver so that the first bit of each vector Cr is assigned to a first bit of the CU of a starting address, and a last bit of each vector Cr is assigned to the first bit of the CU. The subject is a last bit of a last CU assigned to the corresponding sub-channel.

When a sub-channel set does not fill the entire CIF, all the unallocated CUs should be filled with padding bits. A value of the padding bit should have a value of an $(i+1)^{th}$ bit of the PRBS signal when an $(i+1)^{th}$ bit of the CIF belongs to a CU that contains padding bits.

Figure 6A:
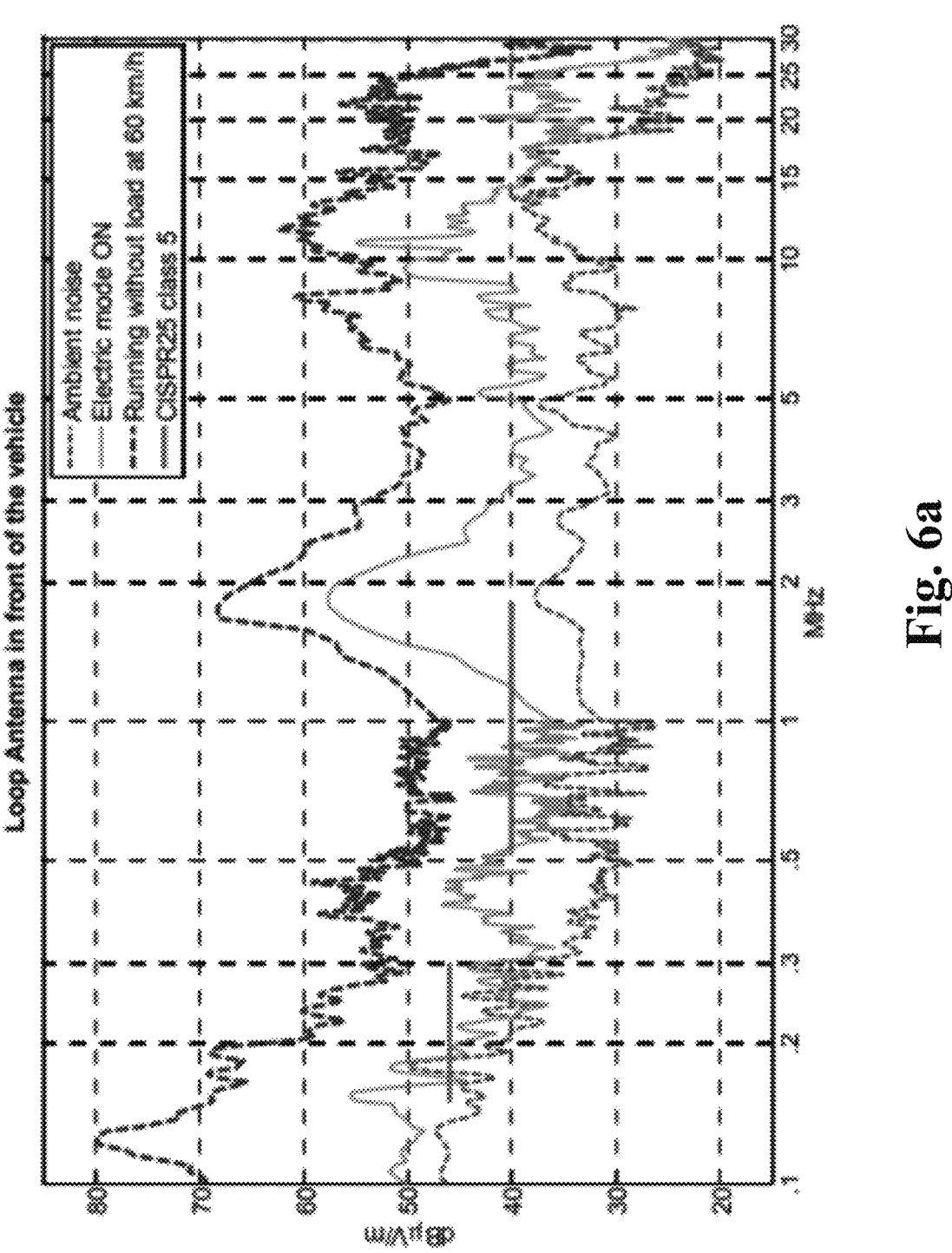
FIGS. 6A and 6B are graphs showing noise distributions for an electric vehicle according to the present embodiment.
Figure 6B:
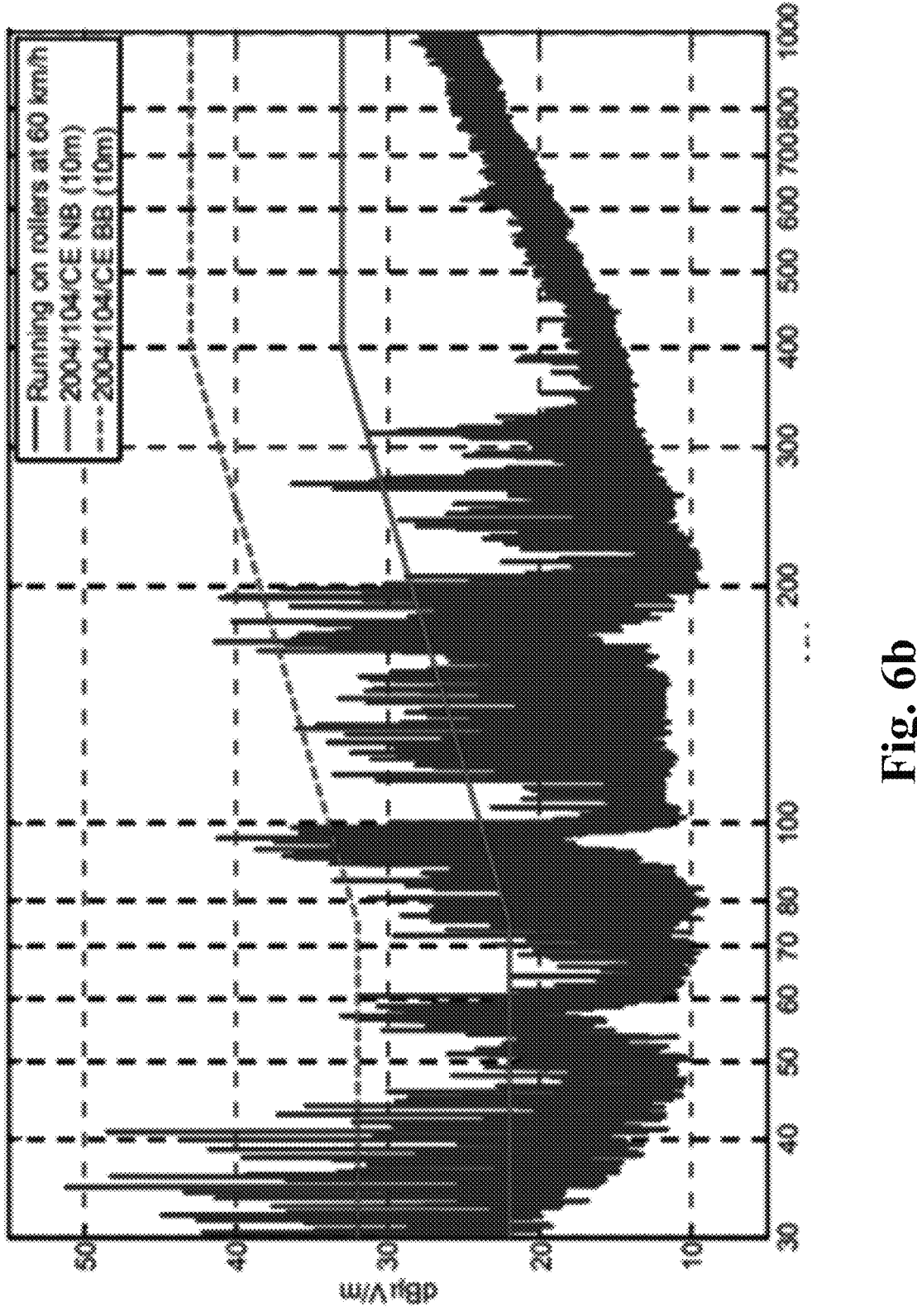

FIGS. 6A and 6B are graphs showing noise distributions for an electric vehicle according to the present embodiment.

FIG. 6A shows wideband noise generated from an electric vehicle. FIG. 6B shows results of tracking noise generated from a loop antenna in front of the vehicle according to a vehicle speed.

The above description is only an example describing the technical spirit of the present embodiment. Various changes and modifications may be made without departing from the spirit and scope of the present embodiment by those skilled in the art. Therefore, embodiments disclosed in the present embodiment and the accompanying drawings should be considered in a descriptive sense only and not for limiting the technological scope. The technical spirit of the present embodiment is not limited by these embodiments and the accompanying drawings. It should be understood that the scope of the present embodiment is interpreted according to the appended claims and encompasses all equivalent technological scopes.

Mode of the Invention

Modes of the invention have been described together in the above Best Mode of the Invention.

INDUSTRIAL APPLICABILITY

The present invention has industrial applicability because it makes it possible to output a bitstream after removing wideband noise of an electric vehicle.

The invention claimed is:

1. An active noise removal apparatus comprising:
a data reception unit configured to receive a bitstream from a transmission device;
a deinterleaver configured to deinterleave the bitstream to generate deinterleaved data;

a decoder configured to decode the deinterleaved data to generate decoded data;
an error check unit configured to check whether an error is detected in the decoded data;
an encoder configured to encode the decoded data to generate encoded data and then transmit the generated encoded data to the decoder when an error is detected in the decoded data;
an interleaver configured to interleave the encoded data to generate interleaved data;
a weight-based channel status determination unit configured to apply a weight for a channel status to the interleaved data to generate weight-based channel status determination information and transmit the generated weight-based channel status determination information to the decoder;
wherein the decoder includes:
a first decoder that decodes the deinterleaved data to generate first decoded data;
a second decoder that decodes the weight-based channel status determination information to generate second decoded data; and
a third decoder that decodes at least one of the first decoded data and the second decoded data to generate third decoded data.

2. The active noise removal apparatus of claim 1, wherein, when no error is detected in the third decoded data, the error check unit determines that there is no noise in corresponding data ("No error") and outputs the corresponding data.

3. The active noise removal apparatus of claim 1, wherein, when an error is detected in the third decoded data, the error check unit determines that there is noise in corresponding data ("Found Error") and transmits the corresponding data to an optimization check unit.

4. The active noise removal apparatus of claim 1, further comprising an optimization check unit configured to check whether an error detected from the third decoded data is within a preset critical range.

5. The active noise removal apparatus of claim 1, wherein, when the error detected from the third decoded data is within the preset critical range, the optimization check unit determines that the corresponding data has weak noise and outputs the corresponding data ("Full Optimized").

6. The active noise removal apparatus of claim 1, wherein, when the error detected from the third decoded data is outside of the preset critical range, the optimization check unit determines that the corresponding data requires additional optimization and transmits the corresponding data to a Reed-Solomon (RS) encoder ("Possible More Optimization").

7. The active noise removal apparatus of claim 1, wherein the decoder further includes an unallocated capacity unit (CU) check unit that checks whether there is an unallocated CU that is not used in the deinterleaved data.

8. The active noise removal apparatus of claim 7, wherein, when there is an unallocated CU that is not used in the deinterleaved data, the unallocated CU check unit generates CU allocation data obtained by filling the unallocated CU with a pseudo random binary sequence (PRBS) signal and then transmits the generated CU allocation data to a weight-based channel status determination unit.

9. The active noise removal apparatus of claim 8, wherein the weight-based channel status determination unit assigns a weight to channel status information (CSI) of a channel (mutually known pattern) related to the PRBS on the basis of the PRBS included in the CU allocation data to reduce a probability of errors.

\* \* \* \* \*